US006566209B2

(12) United States Patent
Chan et al.

(10) Patent No.: US 6,566,209 B2
(45) Date of Patent: May 20, 2003

(54) METHOD TO FORM SHALLOW JUNCTION TRANSISTORS WHILE ELIMINATING SHORTS DUE TO JUNCTION SPIKING

(75) Inventors: Lap Chan, San Francisco, CA (US); Cher Liang Cha, Singapore (SG); Ravishankar Sundaresan, Plano, TX (US)

(73) Assignee: Chartered Semiconductor Manufacturing Ltd., Singapore (SG)

(*) Notice: Subject to any disclaimer, the term of this patent is extended or adjusted under 35 U.S.C. 154(b) by 19 days.

(21) Appl. No.: 09/943,307

(22) Filed: Aug. 31, 2001

(65) Prior Publication Data

US 2002/0003264 A1 Jan. 10, 2002

Related U.S. Application Data

(62) Division of application No. 09/377,543, filed on Aug. 19, 1999, now Pat. No. 6,297,109.

(51) Int. Cl.$^7$ .............................................. H01L 21/336
(52) U.S. Cl. ...................... 438/300; 438/303; 438/592; 438/595; 438/684; 438/685
(58) Field of Search ................................. 438/197, 299, 438/300, 303, 592, 595, 653, 655, 656, 683, 685, 666, 684

(56) References Cited

U.S. PATENT DOCUMENTS

| 5,447,874 A | | 9/1995 | Grivna et al. ................. 437/40 |
| 5,656,519 A | * | 8/1997 | Mogami ....................... 438/303 |
| 5,674,774 A | | 10/1997 | Pasch et al. ............. 437/415 M |
| 5,767,005 A | | 6/1998 | Doan et al. .................. 438/593 |
| 5,786,255 A | | 7/1998 | Yeh et al. .................... 438/299 |
| 5,856,225 A | | 1/1999 | Lee et al. .................... 438/291 |
| 5,937,300 A | * | 8/1999 | Sekine et al. ............... 438/300 |
| 5,994,193 A | * | 11/1999 | Gardner et al. ............. 438/303 |
| 6,051,470 A | * | 4/2000 | An et al. ..................... 438/283 |
| 6,087,231 A | * | 7/2000 | Xiang et al. ................ 438/287 |
| 6,096,642 A | * | 8/2000 | Wu ............................. 438/655 |
| 6,114,209 A | * | 9/2000 | Chu et al. ................... 438/300 |
| 6,124,188 A | * | 9/2000 | Gardner et al. ............. 438/585 |
| 6,140,219 A | * | 10/2000 | Dennison .................... 438/618 |

(List continued on next page.)

FOREIGN PATENT DOCUMENTS

JP         2000-18894 A   *  7/2000

Primary Examiner—Olik Chaudhuri
Assistant Examiner—Fernando Toledo
(74) Attorney, Agent, or Firm—George O. Saile; Rosemary L. S. Pike

(57) ABSTRACT

A method of forming shallow junction MOSFETs is achieved. A gate oxide layer is formed overlying a substrate. A first electrode layer, of polysilicon or metal, is deposited. A silicon nitride layer is deposited. The silicon nitride layer and the first electrode layer are etched through to form temporary MOSFET gates. Ions are implanted into the substrate to form lightly doped junctions. A spacer layer is deposited. The spacer layer and the gate oxide layer are anisotropically etched to form sidewall spacers. Ions are implanted into the substrate to form heavily doped junctions. The silicon nitride layer is etched away. A second electrode layer, of polysilicon or metal, is deposited overlying the substrate, the sidewall spacers, and the first polysilicon layer. The second electrode layer is polished down to the top surfaces of the sidewall spacers to complete the MOSFETs and to form permanent gates and conductive connections to the source and drain junctions. The second electrode layer is etched through to form separate conductive connections. An intermetal dielectric layer is deposited. The intermetal dielectric layer is etched through to form contact openings. A metal layer is deposited and etched through to form separate metal interconnects. A passivation layer is deposited, and the integrated circuit is completed.

7 Claims, 7 Drawing Sheets

U.S. PATENT DOCUMENTS

| | | | | |
|---|---|---|---|---|
| 6,156,613 A | * | 12/2000 | Wu | 438/300 |
| 6,174,794 B1 | * | 1/2001 | Gardner et al. | 438/595 |
| 6,184,129 B1 | * | 2/2001 | Hwang et al. | 438/653 |
| 6,187,641 B1 | * | 2/2001 | Rodder et al. | 438/299 |
| 6,187,642 B1 | * | 2/2001 | Yu et al. | 438/300 |
| 6,190,976 B1 | * | 2/2001 | Shishiguchi et al. | 438/299 |
| 6,190,977 B1 | * | 2/2001 | Wu | 438/300 |
| 6,192,690 B1 | * | 2/2001 | Stautner | 62/6 |
| 6,211,048 B1 | * | 4/2001 | Hwang et al. | 438/592 |

* cited by examiner

METHOD TO FORM SHALLOW JUNCTION TRANSISTORS WHILE ELIMINATING SHORTS DUE TO JUNCTION SPIKING

This is a division of patent application Ser. No. 09/377,543, filing date Aug. 19, 1999 now U.S. Pat. No. 6,297,109, A Method To Form Shallow Junction Transistors While Eliminating Shorts Due To Junction Spiking, assigned to the same assignee as the present invention.

BACKGROUND OF THE INVENTION (1) Field of the Invention

The invention relates to a method of fabricating semiconductor structures, and more particularly, to the formation of shallow junction MOSFETs with a novel technique that eliminates shorts due to junction spiking.

(2) Description of the Prior Art

The next generation of metal-oxide-semiconductor field effect transistor (MOSFET) devices will likely use shallow junction technology in the formation of source and drain regions. Shallow junctions are herein defined as junctions of less than 0.15 microns in depth. Such junctions are necessary to further reduce MOSFET channel lengths and thus achieve greater packing densities and switching speeds.

One problem encountered in the use of shallow junction devices is that of junction spiking. It is typical in the art to contact metal conductor layers directly to the surface of substrate junctions. It is possible that metal will diffuse into the bulk of the junction and form a spike. In the case of relatively deep junctions, this spike does not necessarily pose a problem. For shallow junctions, however, this metal spike can be deep enough to short across the junction into the substrate below.

In addition, the use of suicides to prevent metal spiking is not practical for shallow junctions. The formation of silicide consumes part of the substrate during the anneal process. In the case of shallow junctions, the junction remaining after the silicide formation will tend to exhibit unacceptable junction leakage.

Referring to FIG. 1, a cross-section of a partially completed prior art integrated circuit is shown. A silicon substrate 10 is shown. Isolation regions, formed by shallow trench isolation (STI), are also shown 14. A gate oxide layer 18 has been grown or deposited on the surface of the silicon substrate 10. A polysilicon layer 22 is deposited overlying the gate oxide layer 18 as conventional in the art.

Referring to FIG. 2, a reactive ion etch (RIE) has been performed to pattern the polysilicon layer 22 to form the gate electrode for a planned MOSFET device. During the etch process, an undesirable effect call microtrenching can sometimes occur. In microtrenching, an enhanced etch attack is seen at the edge of the polysilicon gate and can result in the etch breaking through the gate oxide layer 18. When this occurs, a microtrench 26 can form. The use of bromine- and oxygen-containing gases in the etch process can increase the etch selectivity and reduce the likelihood of microtrenching. However, this effect does still occur for ultra-thin gate dielectrics. When a microtrench 26 is formed, it is a likely location for a metal junction spike to form in subsequent processing.

Referring to FIG. 3, the results of further processing of the prior art MOSFET structure are shown. The gate electrode, including sidewall spacers 38, has been fabricated. Shallow junctions have been formed with lightly doped junctions 30 and heavily doped junctions 34. An intermetal dielectric layer 42 was deposited and etched to form contact openings. A metal layer 46 was deposited to fill the contact openings and patterned to form interconnects. Finally, a passivation layer 50 was deposited to complete the MOSFET structure.

A metal spike 44 is shown formed in the junction region of the MOSFET. The metal spike 44 may have formed due, in part, to the aforementioned microtrench 26 feature from the gate etch step or by other means. The metal spike is shown to have penetrated entirely through the shallow junction and into the underlying silicon substrate 10. The short will cause the MOSFET to fail and this device will be rejected during the testing process.

Several prior art approaches disclose methods to form gate, source, or drain electrodes using polysilicon and chemical mechanical polish techniques. U.S. Pat. No. 5,856,225 to Lee et al discloses a method to form self-aligned, ion implanted channel regions in MOSFETs following the formation of source and drain regions. A sacrificial polysilicon gate is formed and then removed to open the channel region for implantation. Chemical mechanical polishing is used to define the gate electrode from a second polysilicon deposition. U.S. Pat. No. 5,786,255 to Yeh et al teaches a process to form a MOSFET where the polysilicon contact layer for the source and drain regions is defined by a chemical mechanical polish. The gate and isolation regions are formed in a silicon nitride layer that then is etched away to leave the gate and isolation regions above the surface of the silicon substrate. U.S. Pat. No. 5,674,774 to Pasch et al discloses a method to define source and drain remote polysilicon contacts by chemical mechanical polishing of a polysilicon layer. U.S. Pat. No. 5,767,005 to Doan et al teaches a process to form floating gates for EEPROMs using a chemical mechanical polish of the polysilicon layer. U.S. Pat. No. 5,447,874 to Grivna et al discloses a process to form a dual metal gate.

SUMMARY OF THE INVENTION

A principal object of the present invention is to provide an effective and very manufacturable method of fabricating shallow junction MOSFETs in the manufacture of integrated circuits.

A further object of the present invention is to provide a method to fabricate shallow junction MOSFETs in which the gate electrodes are comprised of polysilicon.

A yet further object of the present invention is to provide a method to fabricate shallow junction MOSFETs in which the gate electrodes are comprised of polysilicon and in which metal junction spiking is eliminated by contacting the source and drain junctions with polysilicon instead of metal.

Another yet further object of the present invention is to provide a method to fabricate shallow junction MOSFETs in which the gate electrodes are comprised of polysilicon and in which metal junction spiking is eliminated by reducing the thickness of the polysilicon gate layer and thereby reducing the likelihood of microtrenching during the polysilicon etch.

Another further object of the present invention is to provide a method to fabricate shallow junction MOSFETs in which the gate electrodes are comprised of metal.

Another still further object of the present invention is to provide a method to fabricate shallow junction MOSFETs in which metal junction spiking is eliminated by constructing the gate electrodes of metal and thereby eliminating microtrenching due to the polysilicon etch.

Another further object of the present invention is to provide a method to fabricate MOSFETs with improved topology across the drain, source and gate so that the intermetal dielectric coverage and contact etch are made easier.

In accordance with the objects of this invention, a new method of fabricating shallow junction MOSFETs has been achieved. A substrate is provided with isolation regions separating active device areas. A gate oxide layer is grown overlying the substrate. A first polysilicon layer is deposited overlying the gate oxide layer. A silicon nitride layer is deposited overlying the first polysilicon layer. The silicon nitride layer and the first polysilicon layer are patterned to form temporary gates for planned MOSFETs. Ions are implanted into the substrate to form lightly doped junctions where the temporary gates and the isolation regions act as implanting masks. A spacer layer is deposited overlying the gate oxide layer and the temporary gates. The spacer layer and the gate oxide layer are anisotropically etched to form sidewall spacers adjacent to the temporary gates and overlying a part of the lightly doped junctions. Ions are implanted into the substrate to form heavily doped junctions where the temporary gates, the sidewall spacers, and the isolation regions act as masks for the implant and where the heavily doped regions and lightly doped regions form the source and drain junctions for the planned MOSFETs. The silicon nitride layer is etched away. A second polysilicon layer is deposited overlying the substrate, the sidewall spacers, and the first polysilicon layer. The second polysilicon layer is polished to below the top surfaces of the sidewall spacers to complete the MOSFETs by forming permanent gates from the temporary gates, and to form conductive connections to the source and drain junctions. Ions are implanted into the second polysilicon layer. A silicide layer is formed overlying the surface of the second polysilicon layer. The silicide layer and second polysilicon layer are patterned to form separate conductive connections. An intermetal dielectric layer is deposited overlying the MOSFETs, the substrate, and the isolation regions. The intermetal dielectric layer is patterned to form contact openings to the gates and to the conductive connections for the sources and drains. A metal layer is deposited overlying the intermetal dielectric layer and filling the contact openings. The metal layer is patterned to form separate metal interconnects. A passivation layer is deposited overlying the metal interconnects and the intermetal dielectric layer, and the integrated circuit is completed.

Also in accordance with the objects of this invention, a new method of fabricating shallow junction MOSFETs has been achieved. A substrate is provided with isolation regions separating active device areas. A gate oxide layer is grown overlying the substrate. A first metal layer is deposited overlying the gate oxide layer. A silicon nitride layer is deposited overlying the first metal layer. The silicon nitride layer and the first metal layer are patterned to form temporary gates for planned MOSFETs. Ions are implanted into the substrate to form lightly doped junctions where the temporary gates and the isolation regions act as implanting masks. A spacer layer is deposited overlying the gate oxide layer and the temporary gates. The spacer layer and the gate oxide layer are anisotropically etched to form sidewall spacers adjacent to the temporary gates and overlying a part of the lightly doped junctions. Ions are implanted into the substrate to form heavily doped junctions where the temporary gates, the sidewall spacers, and the isolation regions act as masks for the implant and where the heavily doped regions and lightly doped regions form the source and drain junctions for the planned MOSFETs. A barrier layer is deposited overlying the substrate and the silicon nitride layer. The silicon nitride layer is etched away along with the barrier layer that overlies the silicon nitride. A second metal layer is deposited overlying the barrier layer, the sidewall spacers, and the first metal layer. The second metal layer is polished to below the top surface of the sidewall spacers to complete the MOSFETs by forming permanent gates from the temporary gates, and to form conductive connections to the source and drain junctions. The second metal layer is patterned to form separate conductive connections. An intermetal dielectric layer is deposited overlying the MOSFETs, the substrate, and the isolation regions. The intermetal dielectric layer is patterned to form contact openings to the gates and to the conductive connections for the sources and drains. A third metal layer is deposited overlying the intermetal dielectric layer and filling the contact openings. The third metal layer patterned to form separate metal interconnects. A passivation layer is deposited overlying the metal interconnects and the intermetal dielectric layer, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

The present invention is disclosed as two preferred embodiments. First, the present invention is used to create shallow junction MOSFETs with polysilicon gate electrodes. Second, the present invention is used to create shallow junction MOSFETs with metal gate electrodes.

Figure 1:
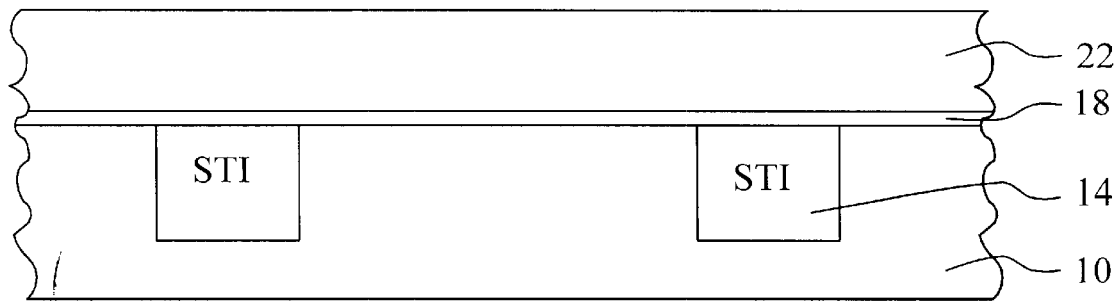
FIGS. 1 through 3 schematically illustrate in cross-section partially completed prior art shallow junction MOSFETs in an integrated circuit device.
Figure 2:
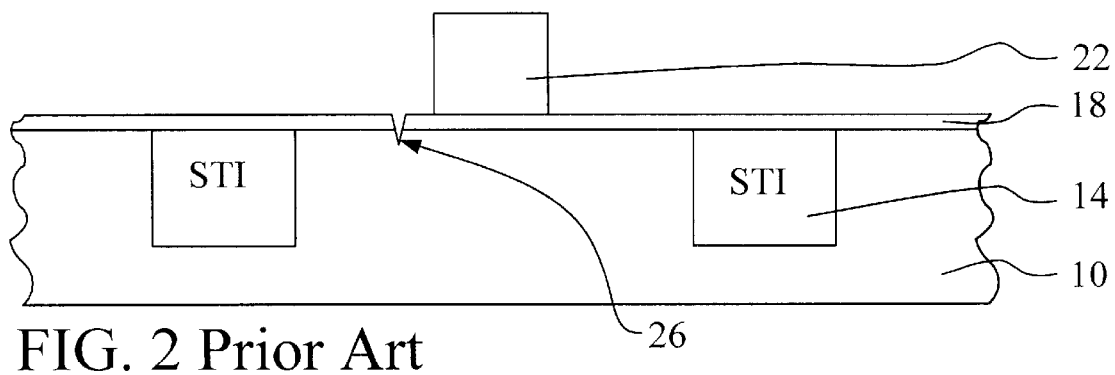
Figure 3:
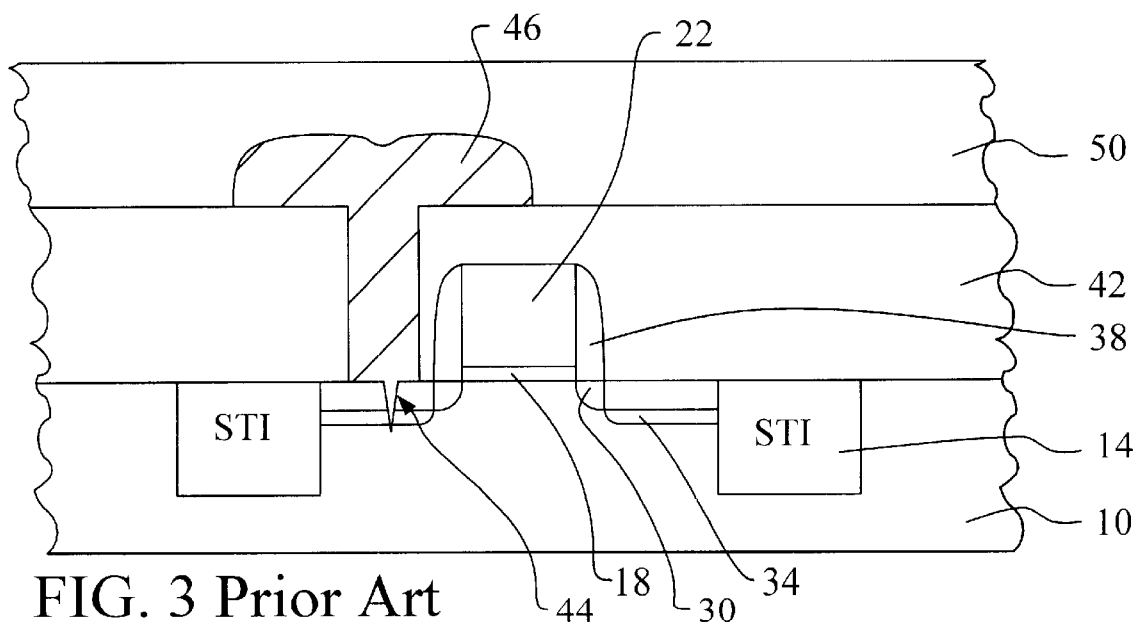
Figure 4:
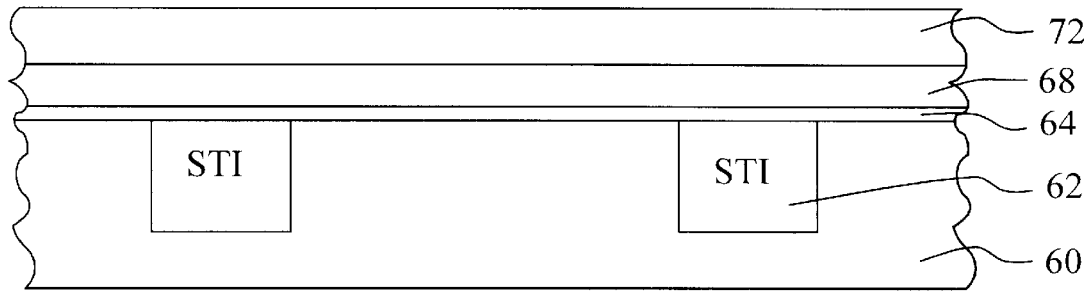
FIGS. 4 through 7 schematically illustrate in cross-sectional representation preferred embodiments of the present invention used to form shallow junction MOSFETS.

Referring now more particularly to FIG. 4, there is illustrated a cross section of a partially completed integrated circuit device. The substrate 60 is preferably composed of monocrystalline silicon. Shallow trench isolations (STI) 62 are conventionally formed in the substrate 60 as a means of separating active device areas. Local oxidation of silicon (LOCOS) could also be used to create the isolation regions. A gate oxide layer 64 is formed overlying the silicon substrate 60. The gate oxide layer 64 may be formed by thermal oxidation of the substrate 60 or by chemical vapor deposition (CVD).

A first polysilicon layer 68 is deposited overlying the gate oxide layer 64. The first polysilicon layer 68 can be deposited using any of a variety of CVD methods. The first polysilicon layer 68 may be deposited undoped and then implanted to reduce resistivity. The first polysilicon layer 60 may also deposited using insitu doping. In the preferred embodiment, the first polysilicon layer is deposited by low pressure chemical vapor deposition (LPCVD).

A silicon nitride layer 72 is deposited overlying the first polysilicon layer 68. The silicon nitride layer is deposited in a LPCVD process. The thicknesses of the first polysilicon layer 68 and the silicon nitride layer 72 are important features of the first embodiment of the present invention. The combined thickness of the first polysilicon layer 68 and the silicon nitride layer 72 will create the final thickness of the MOSFET gate. By including a silicon nitride layer 72, that will ultimately be etched away and replaced with an additional polysilicon layer, the thickness of the first polysilicon layer 68 may be reduced while still maintaining the overall gate thickness desired in the final MOSFET structure. Reducing the thickness of the first polysilicon layer 68 is key to reducing the frequency of occurrence of microtrenches. In the preferred embodiment, the first polysilicon layer 68 is deposited to a thickness of between about 500 Angstroms and 1,500 Angstroms. The silicon nitride layer 72 is deposited to a thickness of between about 500 Angstroms and 1,500 Angstroms.

Figure 5:
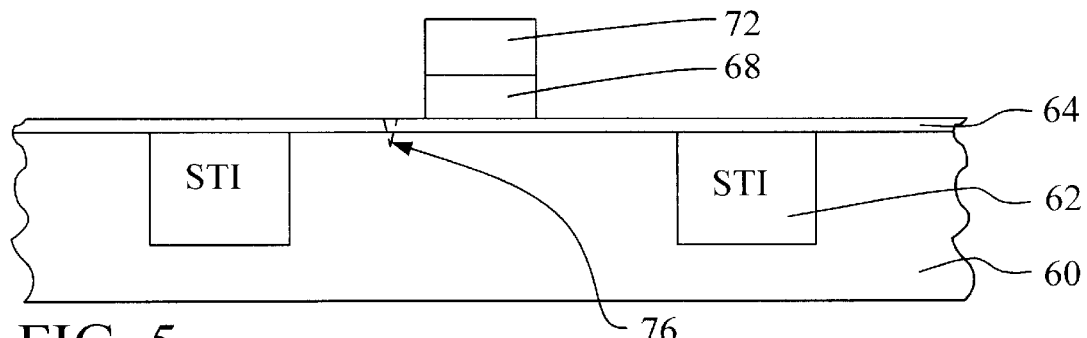

Referring now to FIG. 5, the silicon nitride layer 72 and the first polysilicon layer are etched through where not protected by a mask, which is not shown, to form temporary gates for planned MOSFETs. The gates are termed temporary, because, during the subsequent processing steps, the silicon nitride layer 72 will be removed and replaced with additional polysilicon. The etch is performed using either a reactive ion etching (RIE) process or a wet etch. A preferred reactive ion etch process for this step comprises $SF_6$ and $O_2$ or HBr, $SF_6$, and $O_2$. A preferred wet etch comprises $H_3PO_4$ (phosphoric acid).

As noted earlier, the use of the silicon nitride layer 72 to fill out the total thickness of the gate allows the first polysilicon layer 68 to be thinner than in the conventional art. During the polysilicon etch, it is still possible for microtrenches 76 to occur. However, because the first polysilicon layer 68 is thinner, fewer microtrenches will occur in practice. This feature of the present invention will reduce the yield loss due to metal spike through microtrenches.

Figure 6:
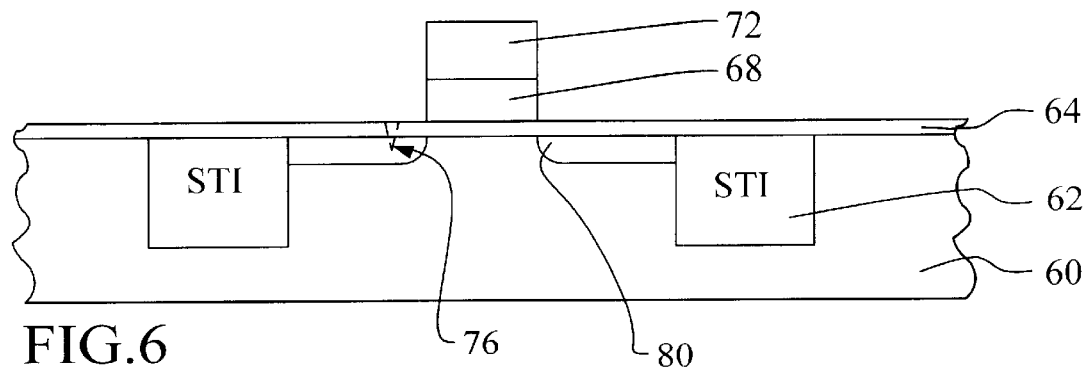

Referring now to FIG. 6, ions are implanted into the substrate to form lightly doped junctions 80 where the temporary gates, comprised of the silicon nitride layer 72 and the first polysilicon layer 68, and the isolation regions act as implanting masks. The lightly doped junctions 80 thus formed are self-aligned to the MOSFET gates. The ion implantation is performed conventionally using an implant species of either P, As or Sb at an implant dose of between about $1\times10^{14}$ atoms/$cm^2$ and $1\times10^{15}$ atoms/$cm^2$ and an energy of between about 20 KeV and 80 KeV.

Figure 7:
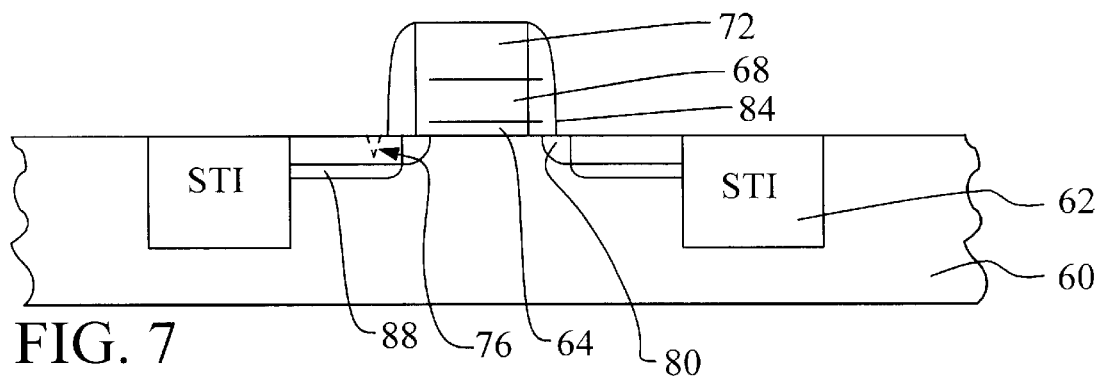

Referring now to FIG. 7, sidewall spacers 84 are conventionally formed. The sidewall spacers are preferably composed of silicon dioxide that is anisotropically etched to form the sidewall spacers 84 adjacent to the temporary gates and overlying a part of the lightly doped junctions 80.

After the sidewall spacers 84 are formed, ions are implanted into the substrate 60 to form heavily doped junctions 88 where the temporary gates, the sidewall spacers 84, and the isolation regions 62 act as masks for the implantation and where the heavily doped regions 88 and the lightly doped regions 80 form the source and drain junctions for the planned MOSFETs. The ion implantation is performed conventionally using an implant species of either P, As, or Sb at an implant dose of between about $1\times10^{15}$ atoms/$cm^2$ and $5\times10^{15}$ atoms/$cm^2$ and an energy of between about 20 KeV and 80 KeV.

Figure 8:
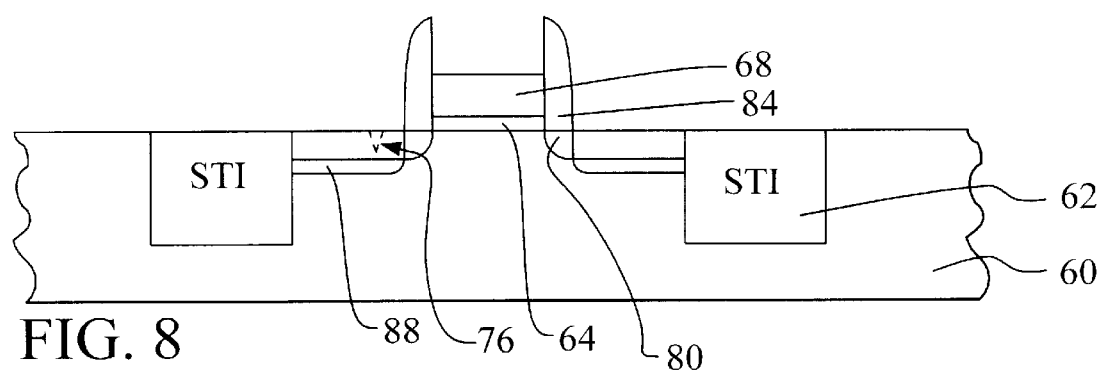
FIGS. 8 through 13 schematically illustrate in cross-sectional representation a first preferred embodiment of the present invention used to form shallow junction polysilicon gate MOSFETs.

Referring now to FIG. 8, another important aspect of the first embodiment of the present invention is shown. Now that the MOSFETs, including sidewall spacers 84, are formed, the silicon nitride layer 72 is etched away. The silicon nitride etch is preferably a wet etch comprising a chemistry of $H_3PO_4$ (phosphoric acid) at between about 120 degrees C. and 180 degrees C. Other chemistries could also be employed to completely etch away the silicon nitride layer 72. By waiting until after the formation of the MOSFET sources and drains and sidewall spacers 84 to remove the silicon nitride layer 72, the present invention insures that the subsequent processing to finish the gate, drain, and source connectivity can be accomplished without additional dry etching at the source and drain region substrate 60 surface. This serves to prevent additional damage, such as microtrenching.

Figure 9:
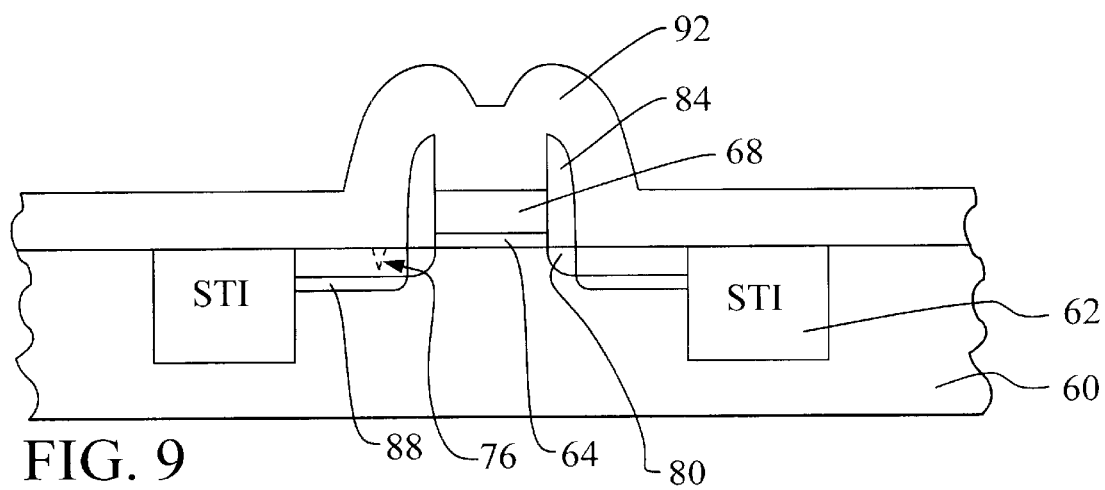

Referring now to FIG. 9, a second polysilicon layer 92 is deposited overlying the substrate 60, the sidewall spacers 84, and the first polysilicon layer 68. The second polysilicon layer 92 can be deposited using any of a variety of CVD methods. The second polysilicon layer 92 may be deposited undoped and then implanted to reduce resistivity. The second polysilicon layer 92 may be deposited by insitu doping. In the preferred embodiment, the second polysilicon layer is deposited, undoped, by low pressure chemical vapor deposition (LPCVD) to a thickness of between about 1,000 Angstroms and 1,500 Angstroms. A large window of values is used here to facilitate CMP process control.

Figure 10:
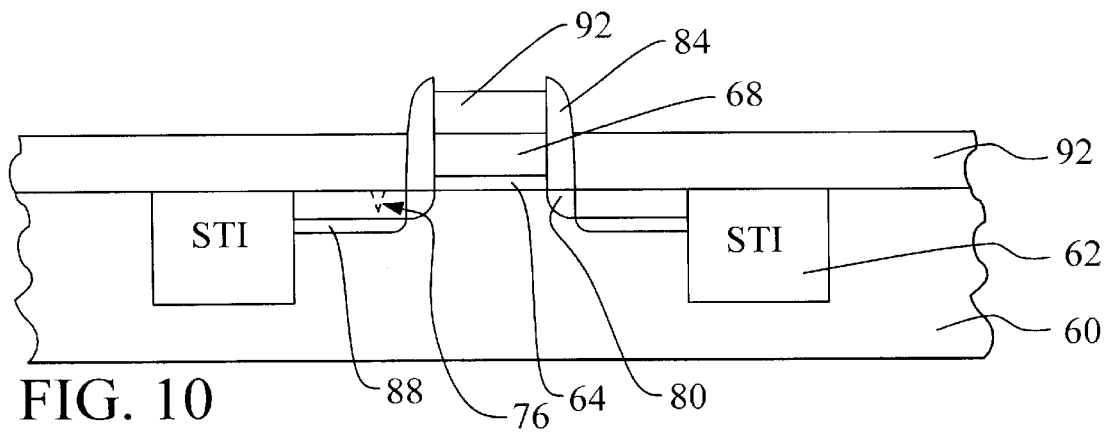

Referring now to FIG. 10, another important part of the present invention is described. The second polysilicon layer 92 is polished to below the top surfaces of the sidewall spacers 84 to complete the MOSFETs by forming permanent gates from the temporary gates, and to form conductive connections to the source and drain junctions. The polishing step is performed using a conventional chemical mechanical polishing (CMP) process selective to polysilicon. In this step, the advantage of forming the sidewall spacers 84 prior to forming the second polysilicon layer 92 becomes clear. No etching step is necessary, because the sidewall spacers 84 separate and electrically isolate the second polysilicon layer 92 in contact with the source, drain, and gate regions.

Figure 11:
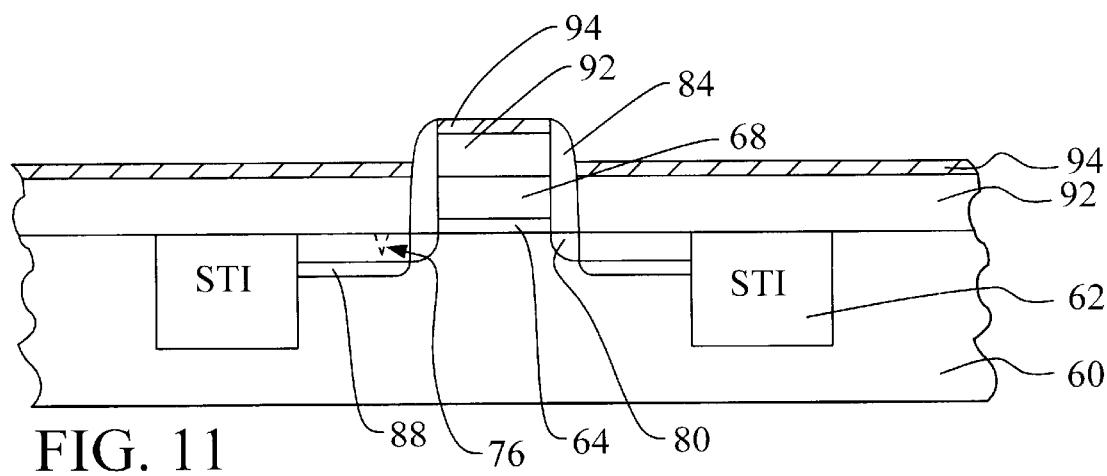

Referring now to FIG. 11, ions are implanted into the second polysilicon layer 92. The implantation is performed as is conventional in the art to reduce the resistivity of the second polysilicon layer 92. The ion implantation is performed using an implant species of either P, As, or Sb at an implant dose of between about $1\times10^{15}$ atoms/$cm^2$ and $1\times10^{16}$ atoms/$cm^2$ and an energy of between about 20 KeV and 80 KeV.

A silicide layer 94 is formed overlying the surface of the second polysilicon layer 92. The purpose of the silicide layer 94 is also to reduce the resistivity of the second polysilicon layer 92. The silicide layer 94 is formed using a conventional process with a metal species of Ti, Co, or Ni. The silicide layer 94 so formed has a thickness of between about 200 Angstroms and 600 Angstroms.

Figure 12:
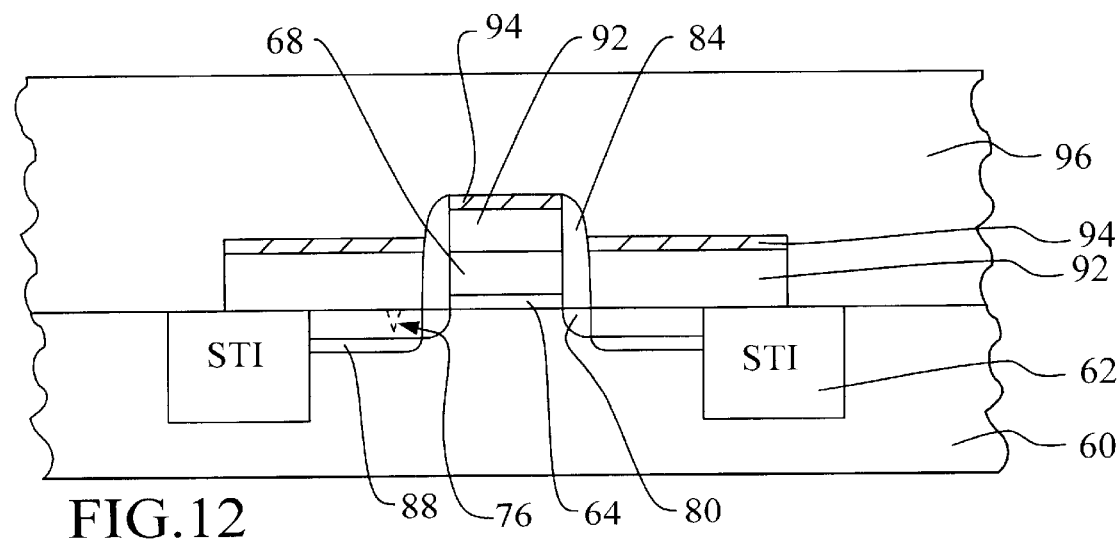

Referring now to FIG. 12, the silicide layer 94 and second polysilicon layer 92 are etched through where not protected by a mask, which is not shown, to form separate conductive connections. By selectively etching in this step, local connects in the second polysilicon layer 92 could be made to other devices. This etching step is performed using conventional etching techniques. Although polysilicon is etched, it does not create additional microtrenching problems as experienced with the first polysilicon layer 68 etch. This is because the etching line is over the isolation regions 62 and not over the shallow junctions 80 and 88.

An intermetal dielectric layer 96 is deposited overlying the MOSFETs, the substrate 60, and the isolation regions 62. The intermetal dielectric layer 96 may be any of several conventional materials deposited by conventional techniques. In the preferred embodiment, the intermetal dielectric layer 96 is composed of silicon dioxide deposited by LPCVD.

Figure 13:
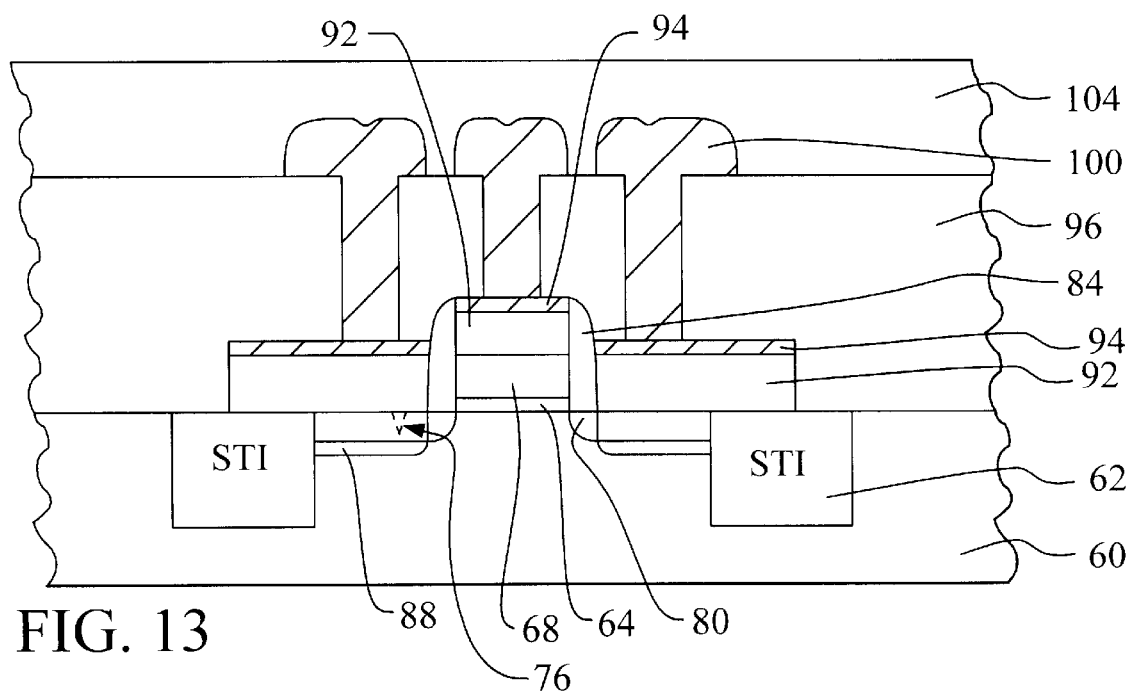

Referring now to FIG. 13, the intermetal dielectric layer 96 is etched through, where not protected by a mask, which is not shown, to the silicide layer 94, to form contact openings to the gates and to the conductive connections for the sources and drains. A metal layer 100 is conventionally deposited overlying the intermetal dielectric layer 96 and filling the contact openings. The metal layer 100 is etched through to the top surface of the intermetal dielectric layer 96 to form separate metal interconnects. A passivation layer 104 of plasma-enhanced, CVD silicon nitride is deposited overlying the metal interconnects and the intermetal dielectric layer 96, and the integrated circuit is completed.

The advantage of the present invention as shown in the first preferred embodiment can now be seen. As described above, the novel process sequence, and particularly the reduced thickness of the first polysilicon layer 68, reduces the likelihood of the formation of microtrenches 76 during the polysilicon etch. If a microtrench 76 does form, however, a metal spike and short condition will not result. The novel polysilicon source and drain contacts, comprised of the second polysilicon layer 92, will prevent a metal short from occurring. The second polysilicon layer 92 will fill or cover any microtrenches 76 that occur. Because of the polysilicon source and drain contacts, current will wrap around the microtrenches 76 and flow without defect. In addition, because the source and drain contacts are made with the second polysilicon layer 92, no deep metal spikes will occur. Any metal spiking will be into the polysilicon layer and will thus be of no consequence. Therefore, yield loss due to shorts is eliminated.

Finally, the polysilicon contact plugs for the source and drain regions raise the level of the intermetal dielectric layer 96 contact opening etch. The etch depth to create contact openings for the source and drain is essentially the same as that for the gate. Consequently, the present invention creates a preferred etching topology that is easier to manufacture.

Referring now again to FIG. 4, a second preferred embodiment of the present invention will be described. The substrate 60 is again preferably composed of monocrystalline silicon. Shallow trench isolations (STI) 62 are conventionally formed in the substrate 60 as a means of separating active device areas. Local oxidation of silicon (LOCOS) could also be used to create the isolation regions. A gate oxide layer 64 is formed overlying the silicon substrate 60. The gate oxide layer 64 may be formed by thermal oxidation of the substrate 60 or by chemical vapor deposition (CVD).

A gate electrode layer 68, or first metal layer 68, is deposited overlying the gate oxide layer 64. The gate electrode layer 68 can be deposited by physical vapor deposition (PVD) or CVD. In the preferred embodiment, the gate electrode layer is deposited by CVD. The gate electrode layer 68 may be composed of titanium, titanium alloys, aluminum, aluminum alloys, tungsten, tungsten alloys, copper, or copper alloys. In the preferred embodiment, the gate electrode layer 68 is comprised, for example, of a stack of titanium nitride overlying tungsten or of a stack of tantalum nitride overlying copper.

A silicon nitride layer 72 is deposited overlying the gate electrode layer 68. The silicon nitride layer is deposited in a LPCVD process. The thicknesses of the gate electrode layer 68 and the silicon nitride layer 72 are important features of the second embodiment of the present invention. The combined thickness of the gate electrode layer 68 and the silicon nitride layer 72 will create the final thickness of the MOSFET metal gate electrode. In the preferred embodiment, the gate electrode layer 68 is deposited to a thickness of between about 500 Angstroms and 1500 Angstroms. The silicon nitride layer 72 is deposited to a thickness of between about 500 Angstroms and 1500 Angstroms.

A thin gate electrode layer 68 at this point in the process is important. Because the metal thickness is reduced, the etch time for the metal is also reduced. This lowers the probability of microtrench formation. In addition, the grazing energy for the etch ions is reduced.

Referring now to FIG. 5, the silicon nitride layer 72 and the gate electrode layer 68 are etched through where not protected by a mask, which is not shown, to form temporary gates for planned MOSFETs. The gates are termed temporary, because, during the subsequent processing steps, the silicon nitride layer 72 will be removed and replaced with additional metal. The etch is performed using a conventional reactive ion etching (RIE) process with a preferred etching chemistry of either $SF_6$ and $O_2$ or $BCl_3$, $Cl_2$, and $O_2$.

Referring now to FIG. 6, ions are implanted into the substrate to form lightly doped junctions 80 where the temporary gates, comprised of the silicon nitride layer 72 and the first metal layer 68, and the isolation regions act as implanting masks. The lightly doped junctions 80 thus formed are self-aligned to the MOSFET gates. The ion implantation is performed conventionally using an implant species of either P, As, or Sb at an implant dose of between about $1\times10^{14}$ atoms/cm$^2$ and $1\times10^{15}$ atoms/cm$^2$ and an energy of between about 20 KeV and 80 KeV.

Referring now to FIG. 7, sidewall spacers 84 are conventionally formed. The sidewall spacers are preferably composed of silicon dioxide that is anisotropically etched to form the sidewall spacers 84 adjacent to the temporary gates and overlying a part of the lightly doped junctions 80.

After the sidewall spacers 84 are formed, ions are implanted into the substrate 60 to form heavily doped junctions 88 where the temporary gates, the sidewall spacers 84, and the isolation regions 62 act as masks for the implantation and where the heavily doped regions 88 and the lightly doped regions 80 form the source and drain junctions for the planned MOSFETs. The ion implantation is performed conventionally using an implant species of either P, As, or Sb at an implant dose of between about $1\times10^{15}$ atoms/cm$^2$ and $5\times10^{15}$ atoms/cm$^2$ and an energy of between about 20 KeV and 80 KeV.

A barrier layer 108 is deposited overlying the silicon nitride layer 72 and the substrate 60. The purpose of the barrier layer is to eliminate metal diffusion into the substrate 60. The barrier layer may be composed of any of several refractory metals used, typically, in combination with refractory metal nitrides. In the preferred embodiment, the barrier layer 108 is comprised of titanium nitride and tantalum nitride deposited by plasma enhanced CVD to a thickness of between about 50 Angstroms and 200 Angstroms.

Figure 14:
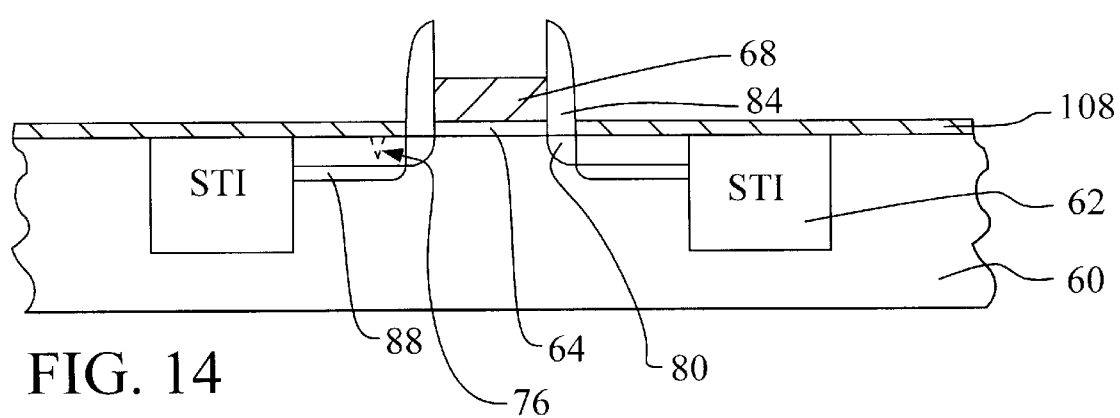
FIGS. 14 through 18 schematically illustrate in cross-sectional representation a second preferred embodiment of the present invention used to form shallow junction metal gate MOSFETs.

Referring now to FIG. 14, the silicon nitride layer 72 is etched away. The silicon nitride etch is preferably a wet etch comprising a chemistry of $H_3PO_4$ (phosphoric acid) at a temperature of between about 120 degrees C. and 180 degrees C. The barrier layer 108 overlying the silicon nitride layer 72 of the temporary gate is also removed. The barrier layer 108 remains overlying the substrate 60 in non-gate areas. By waiting until after the formation of the MOSFET sources and drains and sidewall spacers 84 to remove the silicon nitride layer 72, the present invention insures that the subsequent processing to finish the gate, drain, and source connectivity can be accomplished without additional dry etching at the source and drain region substrate 60 surface. This serves to prevent additional damage, such as microtrenching.

Figure 15:
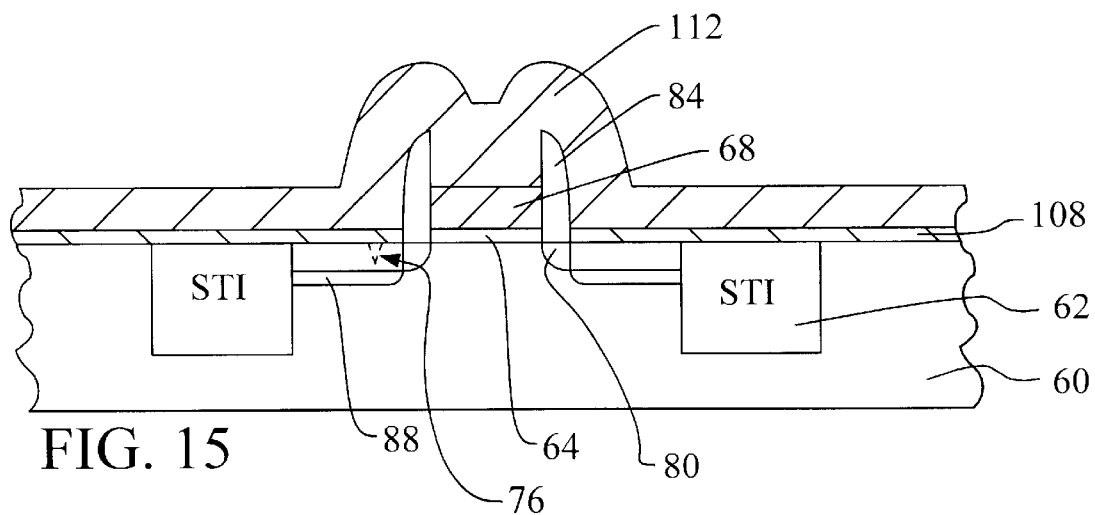

Referring now to FIG. 15, a second metal layer 112 is deposited overlying the barrier layer 108. The second metal layer 112 may be composed of titanium, titanium alloys, aluminum, aluminum alloys, tungsten, tungsten alloys, copper, or copper alloys. The metal may be deposited using PVD or CVD. In the preferred embodiment, the second metal layer 112 is deposited to a thickness of between about 1,000 Angstroms and 1,500 Angstroms. In the preferred embodiment, the second metal layer 112 is comprised, for example of a stack of titanium nitride overlying tungsten or of a stack of tantalum nitride overlying copper.

Figure 16:
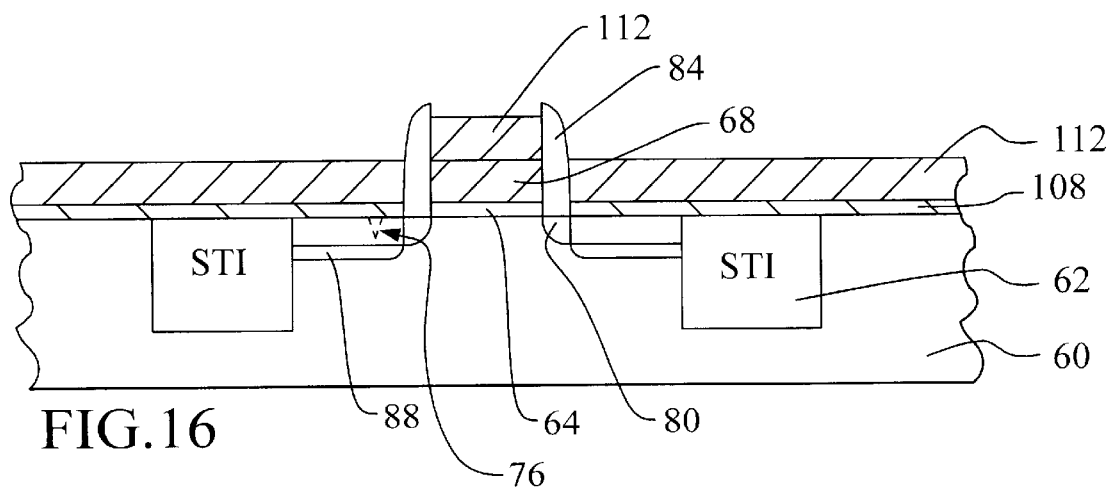

Referring now to FIG. 16, another important part of the present invention is described. The second metal layer 112 is polished to below the top surfaces of the sidewall spacers 84 to complete the MOSFETs by forming permanent gates from the temporary gates, and to form conductive connections to the source and drain junctions. The polishing step is performed using a conventional chemical mechanical polishing (CMP) process selective to metal. In this step, the advantage of forming the sidewall spacers 84 prior to forming the second metal layer 112 becomes clear. No etching step is necessary, because the sidewall spacers 84 separate and electrically isolate the second metal layer 112 in contact with the source, drain, and gate regions.

Figure 17:
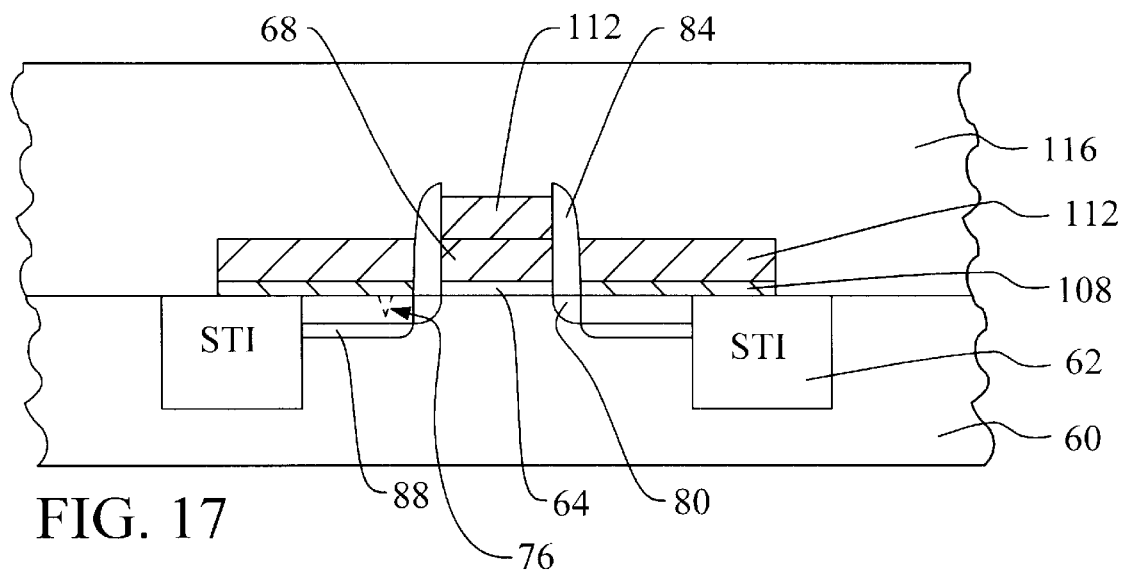

Referring now to FIG. 17, second metal layer 112 and the barrier 108 are etched through where not protected by a mask, which is not shown, to form separate conductive connections. This etching step is performed using conventional etching techniques. Although an etching step is performed, it does not create additional microtrenching problems or substrate damage because the etching line is over the isolation regions 62 and not over the shallow junctions 80 and 88.

An intermetal dielectric layer 116 is deposited overlying the MOSFETs, the substrate, 60, and the isolation regions 62. The intermetal dielectric layer 116 may be any of several conventional materials deposited by conventional techniques. In the preferred embodiment, the intermetal dielectric layer 116 is composed of silicon dioxide deposited by LPCVD.

Figure 18:
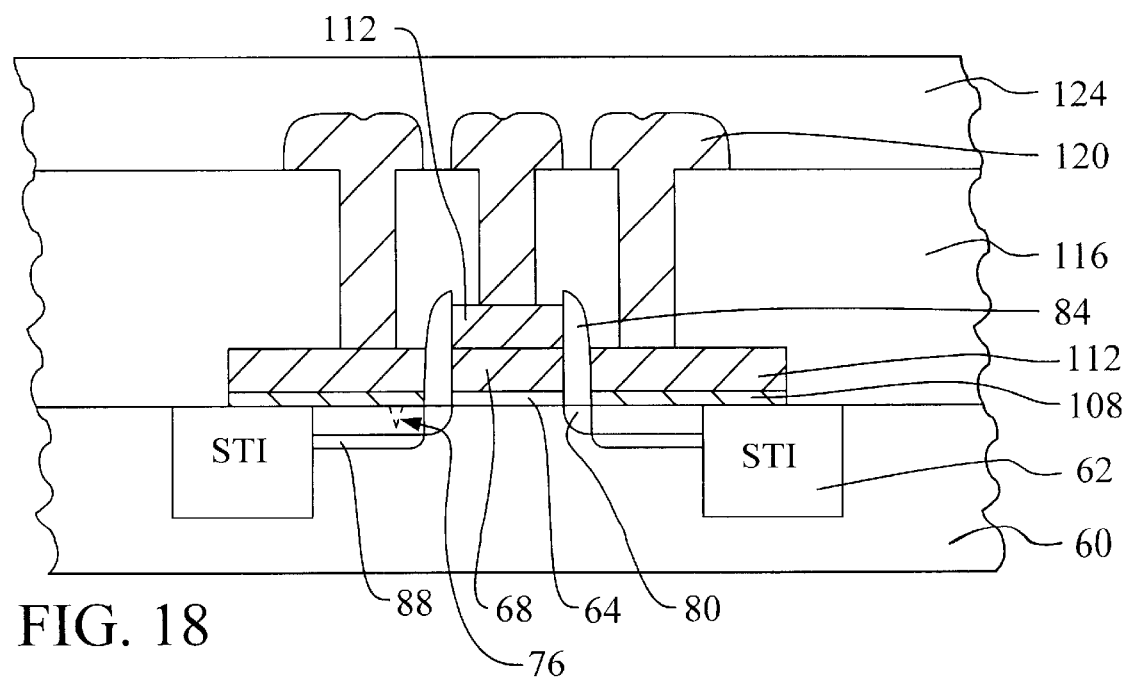

Referring now to FIG. 18, the intermetal dielectric layer 116 is etched through, where not protected by a mask, which is not shown, to the second metal layer 112, to form contact openings to the gates and to the conductive connections for the sources and drains. A third metal layer 120 is conventionally deposited overlying the intermetal dielectric layer 96 and filling the contact openings. The third metal layer 120 is etched through to the top surface of the intermetal dielectric layer 116 to form separate metal interconnects. A passivation layer 124 of plasma-enhanced, CVD silicon nitride is deposited overlying the metal interconnects and the intermetal dielectric layer 116, and the integrated circuit is completed.

The advantage of the present invention as shown in the second preferred embodiment can now be seen. As described above, the novel process sequence, and particularly the use of CMP to form the source and drain connections, reduces the likelihood of the formation of microtrenches 76. If a microtrench 76 does form, however, a metal spike and short condition will not result. The use of a barrier layer 108 over the source and drain regions will prevent a metal short from occurring.

In addition, the metal contact plugs for the source and drain regions raise the level of the intermetal dielectric layer 96 contact opening etch. The etch depth to create contact openings for the source and drain is essentially the same as that for the gate. Consequently, the present invention creates a preferred etching topology that is easier to manufacture.

As disclosed in the preferred embodiments, the present invention provides a very manufacturable process for fabricating shallow junction MOSFETs with either polysilicon or metal gates that eliminates junction spikes and shorts in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method of forming MOSFET transistors in the fabrication of an integrated circuit device comprising:

providing a gate oxide layer overlying a semiconductor substrate;

depositing a first metal layer overlying said gate oxide layer;

depositing a silicon nitride layer overlying said first metal layer;

patterning said silicon nitride layer and said first metal layer to form temporary gates for planned said MOSFET transistors;

implanting ions into said substrate to form lightly doped drain regions wherein said temporary gates act as implanting masks;

forming sidewall spacers adjacent to said temporary gates and overlying a part of said lightly doped drain regions;

implanting ions into said substrate to form heavily doped junctions where said temporary gates and said sidewall spacers act as masks for said implanting and wherein said heavily doped regions and said lightly doped regions form the source and drain junctions for said planned MOSFET transistors;

depositing a barrier layer overlying said semiconductor substrate;

thereafter etching away said silicon nitride layer;

depositing a second metal layer overlying said barrier layer, said first metal layer, and said sidewall spacers; and polishing down said second metal layer to below the top surfaces of said sidewall spacers to complete said MOSFET transistors by forming permanent gates from said temporary gates, and to form conductive connections overlying said source and drain junctions.

2. The method according to claim 1 further comprising:

depositing an intermetal dielectric layer overlying said MOSFET transistors and said semiconductor substrate;

patterning said intermetal dielectric layer to the top surface of said second metal layer to form contact openings to said gates and to said conductive connections for said sources and drains;

depositing a third metal layer overlying said intermetal dielectric layer and filling said contact openings;

patterning said third metal layer to form separate metal interconnects; and depositing a passivation layer overlying said metal interconnects and said intermetal dielectric layer to complete fabrication of said integrated circuit device.

3. The method according to claim 1 wherein said first metal layer comprises one of the group containing: titanium, titanium alloys, aluminum, aluminum alloys, tungsten, tungsten alloys, copper, copper alloys, titanium nitride overlying tungsten, and tantalum nitride overlying copper.

4. The method according to claim 1 wherein said first metal layer is deposited to a thickness of between about 500 Angstroms and 1,500 Angstroms.

5. The method according to claim 1 wherein said silicon nitride layer is deposited to a thickness of between about 500 Angstroms and 1,500 Angstroms.

6. The method according to claim 1 wherein said second metal layer comprises one of the group containing: titanium, titanium alloys, aluminum, aluminum alloys, tungsten, tungsten alloys, copper, copper alloys, titanium nitride overlying tungsten, and tantalum nitride overlying copper.

7. The method according to claim 1 wherein said second metal layer is deposited to a thickness of between about 1,000 Angstroms and 1,500 Angstroms.

* * * * *